(12) United States Patent
Kubota

(10) Patent No.: US 10,672,616 B2
(45) Date of Patent: Jun. 2, 2020

(54) PLASMA PROCESSING APPARATUS AND PLASMA PROCESSING METHOD

(71) Applicant: TOKYO ELECTRON LIMITED, Tokyo (JP)

(72) Inventor: Shinji Kubota, Miyagi (JP)

(73) Assignee: TOKYO ELECTON LIMITED, Tokyo (JP)

(*) Notice: Subject to any disclaimer, the term of this patent is extended or adjusted under 35 U.S.C. 154(b) by 0 days.

(21) Appl. No.: 15/538,267

(22) PCT Filed: Dec. 3, 2015

(86) PCT No.: PCT/JP2015/084040
§ 371 (c)(1),
(2) Date: Jun. 21, 2017

(87) PCT Pub. No.: WO2016/104098
PCT Pub. Date: Jun. 30, 2016

(65) Prior Publication Data
US 2017/0345664 A1 Nov. 30, 2017

(30) Foreign Application Priority Data
Dec. 25, 2014 (JP) .................... 2014-263547

(51) Int. Cl.
*H01J 37/32* (2006.01)
*H01L 21/3065* (2006.01)
(Continued)

(52) U.S. Cl.
CPC .......... *H01L 21/3065* (2013.01); *C23C 14/22* (2013.01); *C23C 16/511* (2013.01);
(Continued)

(58) Field of Classification Search
USPC .......................... 156/345.41, 345.24–345.28; 118/723 MW
See application file for complete search history.

(56) References Cited

U.S. PATENT DOCUMENTS 4,808,258 A * 2/1989 Otsubo ............... C23C 16/517
156/345.44
6,184,623 B1 * 2/2001 Sugai ............... H01J 37/32082
118/723 AN
(Continued)

FOREIGN PATENT DOCUMENTS

JP 7-288191 A 10/1995
JP 2006-128075 A 5/2006
(Continued)

OTHER PUBLICATIONS

International Search Report dated Feb. 16, 2016 in PCT/JP2015/084040.

*Primary Examiner* — Rakesh K Dhingra
(74) *Attorney, Agent, or Firm* — Rothwell, Figg, Ernst & Manbeck, P.C.

(57) ABSTRACT

A plasma processing apparatus includes a microwave generation unit configured to generate a microwave, a processing vessel configured to introduce the microwave thereinto, and a gas supply mechanism configured to supply a gas into the processing vessel, plasma being generated within the processing vessel so that a plasma processing is performed on a processing target object. The microwave generation unit includes an oscillation circuit configured to oscillate the microwave, a pulse generation circuit configured to oscillate a control wave having a predetermined frequency bandwidth at a predetermined cycle, and a frequency modulation circuit configured to modulate a frequency of the microwave to a modulated wave having the predetermined frequency bandwidth by the control wave and output the modulated wave, and the frequency modulation circuit alternately and repeatedly outputs the modulated wave and a non-modulated microwave at the predetermined cycle.

7 Claims, 5 Drawing Sheets

(51) Int. Cl.
*C23C 16/511* (2006.01)
*H05H 1/46* (2006.01)
*C23C 14/22* (2006.01)

(52) U.S. Cl.
CPC ... *H01J 37/32192* (2013.01); *H01J 37/32311* (2013.01); *H05H 1/46* (2013.01)

(56) References Cited

U.S. PATENT DOCUMENTS

| | | | | |
|---|---|---|---|---|
| 6,311,638 | B1* | 11/2001 | Ishii | C23C 16/511 |
| | | | | 118/723 E |
| 2002/0000202 | A1* | 1/2002 | Yuda | C23C 16/402 |
| | | | | 118/723 ER |
| 2009/0255800 | A1* | 10/2009 | Koshimizu | H01J 37/32091 |
| | | | | 204/164 |
| 2014/0038431 | A1* | 2/2014 | Stowell | H01L 21/324 |
| | | | | 438/795 |
| 2014/0148016 | A1* | 5/2014 | Kanazawa | H01J 37/32146 |
| | | | | 438/714 |
| 2014/0197761 | A1* | 7/2014 | Grandemenge | H01J 37/32009 |
| | | | | 315/502 |

FOREIGN PATENT DOCUMENTS

| | | |
|---|---|---|
| JP | 2009-246091 A | 10/2009 |
| JP | 2012-109080 A | 6/2012 |

\* cited by examiner

PLASMA PROCESSING APPARATUS AND PLASMA PROCESSING METHOD

CROSS REFERENCE TO RELATED APPLICATIONS

This application is a 35 U.S.C. 371 National Phase Entry Application from PCT/JP2015/084040, filed Dec. 3, 2015, which claims priority from Japanese Patent Application No. 2014-263547, filed on Dec. 25, 2014, all of which are incorporated herein by reference.

The present disclosure relates to a plasma processing apparatus configured to excite plasma using microwaves and a plasma processing method.

BACKGROUND

A semiconductor element, an organic EL element, or the like is manufactured by performing a processing such as, for example, etching, CVD, or sputtering, on a processing target substrate. In the related art, a plasma processing apparatus using a radial line slot antenna has been known as a plasma processing apparatus that performs a predetermined plasma processing on a processing target object such as, for example, a semiconductor wafer. The radial line slot antenna is disposed on the top of a dielectric window disposed in an opening of a ceiling of a processing vessel, in a state in which a slow wave plate is disposed on the top of a slot plate having a plurality of slots. The radial line slot antenna is connected to a coaxial waveguide at the central portion. With this configuration, microwaves generated by a microwave generation unit are radially transmitted by the slow wave plate via the coaxial waveguide, circularly polarized waves are generated by the slot plate, and then the microwaves are radiated into the processing vessel from the slot plate through the dielectric window. Further, high density plasma having low electron temperature may be generated under low pressure within the processing vessel by the microwaves, and a plasma processing such as, for example, film forming or etching, is performed by the generated plasma. Thus, the method of using the microwaves as a plasma source is advantageous in that the plasma is maintained at a low electron temperature, and as a result, damage to the processing target object is reduced.

In the related art, as a method of introducing microwaves, there is, for example, a method of arranging an annular waveguide or introducing microwaves from a cavity resonance portion through a slit. In addition, the above-described method of introducing microwaves from a radial line slot antenna may control plasma distribution by changing an antenna pattern, and form plasma excellent in uniformity of plasma density by optimizing the shape of the slot antenna. Further, the uniformity may be further improved by bringing a microwave transmitting dielectric and the antenna into close contact with each other. Further, a high-density and stable plasma may be formed by forming a recess in the dielectric, through which the microwaves are introduced, so as to optimize the slot pattern.

In the plasma processing apparatus, a uniform processing throughout the entire surface of the processing target object is required. In order to improve the in-plane uniformity in the plasma processing, it is required to stably form a more uniform plasma within the processing vessel where the plasma processing is performed.

Since very high electric power of about 1 KW to 5 KW is required for microwaves for generating plasma, magnetron oscillation tubes have been used in the related art. However, the oscillation frequencies of the magnetron oscillation tubes are different per each solid, and for example, in the case of 2.45 GHz, the frequency deviations of ±10 MHz or more exist. The frequencies also vary depending on the state of a plasma load, a power, or the like.

In a plasma processing apparatus using microwaves as a plasma source, the influence of the frequency of microwaves is high, and as the frequency is changed, the distribution and density of plasma are changed, and a uniform plasma processing may not be performed. In order to enhance the stability of magnetron frequencies, for example, a method of controlling injected synchronous signals has been studied and improved in the related art, but it was difficult to completely fix the frequencies.

Further, in the relationship between plasma and microwave absorption, a phenomenon is known in which an absorption peak at which microwaves are absorbed to the plasma exists at a specific frequency. However, since the frequency at which the absorption peak occurs changes every moment, it is very difficult to always maintain a state in which the microwaves are absorbed. Moreover, the frequencies of microwaves are influenced by frequency characteristics according to various shapes of, for example, a plasma processing vessel and an antenna waveguide. In addition, it has been difficult to directly monitor the state of plasma density in the related art.

For example, Patent Document 1 discloses that the frequencies of microwaves in a broadband may be made uniform by frequency-modulating carrier signals in a plasma processing apparatus.

In addition, Patent Document 2 discloses a method of generating microwaves efficiently and stably using a solid oscillator.

PRIOR ART DOCUMENT

Patent Document

Patent Document 1: Japanese Patent Laid-Open Publication No. 2012-109080

Patent Document 2: Japanese Patent Laid-Open Publication No. 2006-128075

DISCLOSURE OF THE INVENTION

Problems to be Solved

However, in Patent Document 1, there is a problem in that since it is difficult to attain matching in the entire band as the frequency band is made broader, reflected waves cannot be suppressed.

Further, Patent Document 2 relates to a plasma heating device in which the load state of microwaves is determined by the shape of the vessel and hardly changes. Also, no specific control of frequencies of microwaves to be absorbed to the plasma is described.

The object of the present disclosure is to enhance performance of, for example, plasma etching and plasma film forming by maintaining plasma in a uniform and high-density state in a plasma processing apparatus and plasma processing method using microwaves.

Means to Solve the Problems

To solve the above-described problem, the present disclosure provides a microwave generation unit configured to generate a microwave; a processing vessel configured to introduce the microwave thereinto; and a gas supply mechanism configured to supply a gas into the processing vessel, in which plasma is generated within the processing vessel so that a plasma processing is performed on a processing target object. The microwave generation unit includes an oscillation circuit configured to oscillate the microwave, a pulse generation circuit configured to oscillate a control wave having a predetermined frequency bandwidth at a predetermined cycle, and a frequency modulation circuit configured to modulate a frequency of the microwave to a modulated wave having the predetermined frequency bandwidth by the control wave and output the modulated wave, and the frequency modulation circuit alternately and repeatedly outputs the modulated wave and a non-modulated microwave at the predetermined cycle.

According to another aspect, the present disclosure provides a plasma processing method including: supplying a gas to a processing vessel configured to introduce a microwave thereinto; and generating plasma within the processing vessel to perform a plasma processing on a processing target object. When the microwave is oscillated, a control wave having a predetermined frequency bandwidth is oscillated at a predetermined cycle, the microwave is modulated by the control wave to a modulated wave having the predetermined frequency bandwidth, and the modulated wave and a non-modulated microwave are output alternately and repeatedly.

Effect of the Invention

According to the present disclosure, in a plasma processing apparatus using microwaves and plasma processing method using microwaves, uniformity in plasma processing can be improved since the microwaves can be maintained at a frequency which allows the microwaves to be easily absorbed to the plasma and plasma having a uniform and high plasma density can be stably generated within the processing vessel.

BRIEF DESCRIPTION OF THE DRAWINGS

FIG. 4 illustrates waveform charts for explaining frequency modulation according to the exemplary embodiment of the present disclosure, in which FIG. 4(a) is a view illustrating a timing of a control wave, FIG. 4(b) is a view illustrating a synchronous wave, FIG. 4(c) is a view illustrating a modulated wave that is frequency modulated, and FIG. 4(d) is a view illustrating a monitor wave.

DETAILED DESCRIPTION TO EXECUTE THE INVENTION

Hereinafter, exemplary embodiments of the present disclosure will be described with reference to the accompanying drawings.

Figure 1:
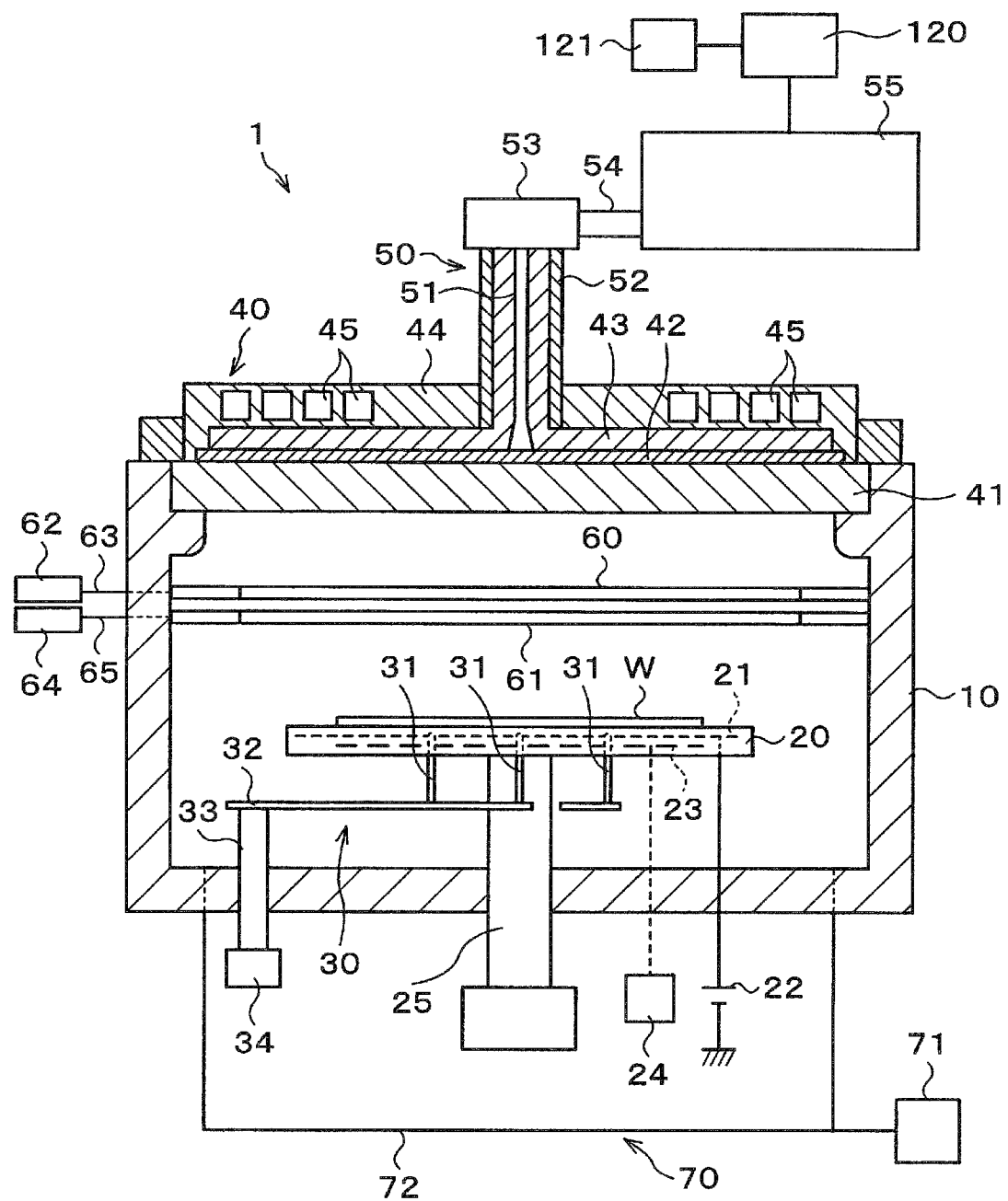
FIG. 1 is a vertical sectional view illustrating a schematic configuration of a plasma processing apparatus according to an exemplary embodiment.

FIG. 1 is a vertical sectional view illustrating a schematic configuration of a plasma processing apparatus 1 according to an exemplary embodiment of the present disclosure. The plasma processing apparatus 1 is a film forming device that includes a plasma generation mechanism that performs a plasma chemical vapor deposition (CVD) processing on a front surface (top surface) of a wafer W as a processing target object. The present disclosure is not limited to the exemplary embodiments to be described below.

The plasma processing apparatus 1 includes a processing vessel 10 as illustrated in FIG. 1. The processing vessel 10 has a substantially cylindrical shape having an opened ceiling, and a radial line slot antenna 40 is disposed in the opening of the ceiling. Further, a wafer W carry-in port (not illustrated) is formed in a lateral side of the processing vessel 10, and a gate valve (not illustrated) is provided in the carry-in port. Also, the interior of the processing vessel 10 is configured to be hermetically sealed. In addition, a metal such as, for example, aluminum, or stainless steel is used for the processing vessel 10, and the processing vessel 10 is electrically grounded.

A cylindrical placing pedestal 20 configured to mount a wafer W on the top surface thereof is provided on a bottom portion within the processing vessel 10. For the placing pedestal 20, for example, AlN, and the like are used.

An electrode 21 for an electrostatic chuck is provided inside the placing pedestal 20. The electrode 21 is connected to a DC power source 22 provided outside the processing vessel 10. A Johnson Rahbeck force is generated on the top surface of the placing pedestal 20 by the DC power source 22, thereby electrostatically attracting the wafer W onto the placing pedestal 20.

Inside the placing pedestal 20, for example, a temperature adjustment mechanism 23 is provided in which a cooling medium is circulated. The temperature adjustment mechanism 23 is provided outside the processing vessel 10 and connected to a liquid temperature controller 24 that adjusts the temperature of the cooling medium. In addition, the temperature of the cooling medium may be adjusted by the liquid temperature controller 24 so as to control the temperature of the placing pedestal 20, and as a result, the wafer W disposed on the placing pedestal 20 may be maintained at a predetermined temperature.

A high frequency power supply (not illustrated) for RF bias may be connected to the placing pedestal 20. The high frequency power source outputs high frequency waves having a predetermined frequency (e.g., 13.65 MHz) suitable for controlling the energy of ions drawn into a wafer W at a predetermined power.

For example, three through holes (not illustrated) penetrating the placing pedestal 20 in a thickness direction are formed in the placing pedestal 20. Lift pins 31 (to be described later) are provided in the through holes by being inserted into the through holes, respectively.

On the bottom surface of the placing pedestal 20, a support member 25 is provided to support the placing pedestal 20.

A lift mechanism 30 that properly moves up and down the wafer W mounted on the placing pedestal 20 is provided below the placing pedestal 20. The lift mechanism 30 includes the lift pins 31, a plate 32, a support column 33, and a lift driving unit 34. For example, three lift pins 31 are provided on the upper surface of the plate 32, and the lift pins 31 are configured to protrude from the top surface of the placing pedestal 20. The plate 32 is supported by the upper end of the support column 33 that penetrates the bottom of the processing vessel 10. The lift driving unit 34 disposed outside the processing vessel 10 is provided at the lower end of the support column 33. With the activation of the lift driving unit 34, the three lift pins 31 penetrating the placing pedestal 20 move up and down to be switched between a state in which the upper ends of the lift pins 31 protrude upwardly from the top surface of the placing pedestal 20 and a state in which the upper ends of the lift pins 31 are drawn into the placing pedestal 20.

The radial line slot antenna that supplies microwaves for plasma generation is provided in the opening in the ceiling of the processing vessel 10. The radial line slot antenna 40 includes a dielectric window 41, a slot plate 42, a slow wave plate 43, and a shield cover 44.

The dielectric window 41 is provided to seal the opening of the ceiling of the processing vessel 10 via a sealing material (not illustrated) such as, for example, an O-ring. Therefore, the interior of the processing vessel 10 is maintained in a hermetically sealed state. For the dielectric window 41, a dielectric such as, for example, quartz, $Al_2O_3$, or AlN is used, and the dielectric window 41 transmits microwaves.

The slot plate 42 is provided on the top surface of the dielectric window 41 to face the placing pedestal 20. For the slot plate 42, a conductive material such as, for example, copper, aluminum, or nickel is used.

The slow wave plate 43 is provided on the upper surface of the slot plate 42. For the slow wave plate 43, a low-loss dielectric material such as, for example, quartz, $Al_2O_3$, or AlN is used, and the slow wave plate 43 shortens the wavelengths of microwaves.

The shield cover 44 is provided to cover the slow wave plate 43 and the slot plate 42 on the top surface of the slow wave plate 42. Inside the shield cover 44, for example, a plurality of annular flow paths 45 are formed in which the cooling medium is circulated. The dielectric window 41, the slot plate 42, the slow wave plate 43, and the shield cover 44 are adjusted to a predetermined temperature by the cooling medium flowing in the flow paths 45.

A coaxial waveguide 50 is connected to the central portion of the shield cover 44. The coaxial waveguide 50 includes an inner conductor 51 and an outer conductor 52. The inner conductor 51 is connected to the slot plate 42. The lower end of the inner conductor 51 is formed in a conical shape and the inner conductor 51 has a tapered shape that the diameter is enlarged toward the slot plate 42. By the lower end, microwaves are made to be efficiently propagated for the slot plate 42.

A mode converter 53 that converts microwaves into a predetermined vibration mode, a waveguide 54, and a microwave generation unit 55 that generates microwaves as high frequency waves are connected to the coaxial waveguide 50 in this order from the coaxial waveguide 50 side. The microwave generation unit 55 generates microwaves having a predetermined frequency (e.g., 2.45 GHz).

Figure 2:
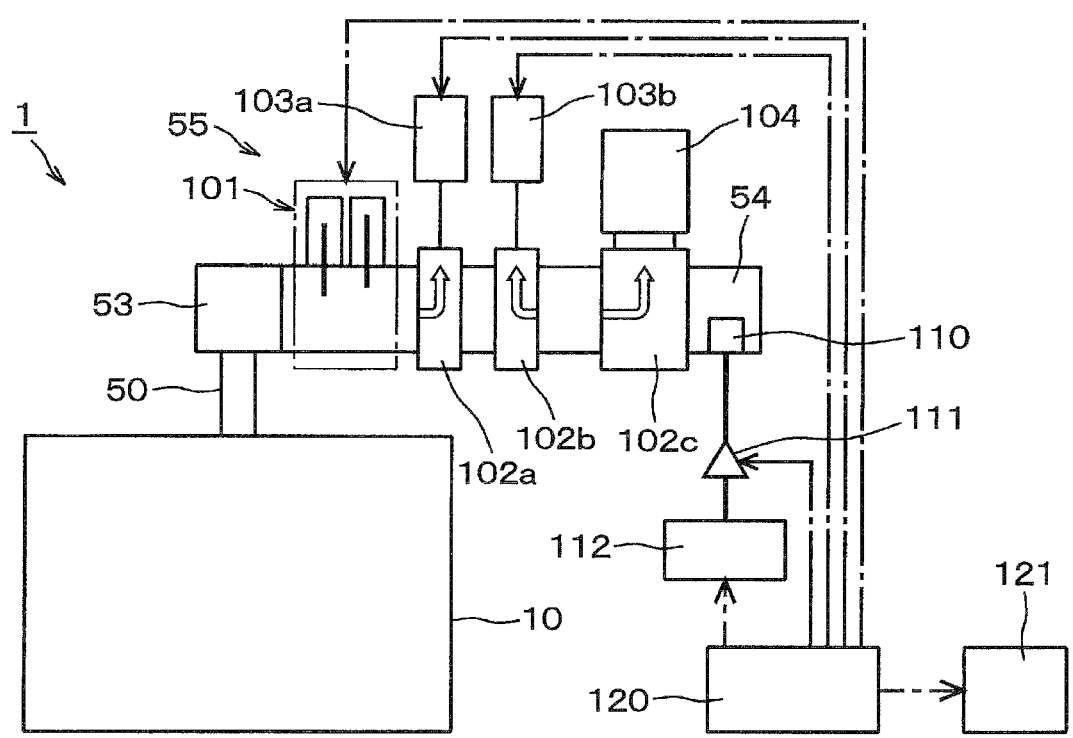
FIG. 2 is a view illustrating a detailed configuration of a microwave generation unit included in the plasma processing apparatus illustrated in FIG. 1.

As illustrated in FIG. 2, the microwave generation unit 55 is provided with a matcher 101, direction couplers 102a and 102b that branch a portion of reflected waves of microwaves from the processing vessel 10 and traveling waves traveling through the interior of the waveguide 54, a direction coupler 102c that branches reflected waves, and a coaxial waveguide converter 110 in this order along the waveguide 54 from the mode converter 53 side. Power detectors 103a and 103b that detect reflected waves and traveling waves, respectively, are connected to the direction couplers 102a and 102b, and the direction coupler 102c is provided with an isolator 104 that blocks reflected waves. Further, a microwave oscillator 112 including, for example, a magnetron, is connected from the coaxial waveguide converter 110 via a microwave amplifier 111.

The microwave generation unit 55 having the above-described configuration is controlled by a controller 120. The controller 120 is connected to the matcher 101, the power detectors 103a and 103b, the microwave amplifier 111, and the microwave oscillator 112, and is also connected to a display device 121 that displays control contents. The controller 120 is, for example, a computer, and has a program storage unit (not illustrated). A program for controlling oscillation of microwaves in the plasma processing apparatus 1 is stored in the program storage unit. Further, the program may be recorded on a computer-readable storage medium H such as, for example, a computer-readable hard disk (HD), a flexible disk (FD), a compact disk (CD), a magnet optical disk (MD), and a memory card, and may be installed in the controller 120 from the storage medium H. In addition, the controller 120 also controls the DC power source 22 or a decompression mechanism 70 of the plasma processing apparatus 1, as well as various sensors and the like (not illustrated).

With this configuration, the microwaves generated by the microwave generation unit 55 sequentially propagate through the waveguide 54, the mode converter 53, and the coaxial waveguide 50 in a manner in which the microwaves are supplied into the radial line slot antenna 40 to be compressed by the slow wave plate 43 to be shortened in wavelength and generate circularly polarized waves by the slot plate 42, and then radiated into the processing vessel 10 by transmitting the dielectric window 41 from the slot plate 42. By these microwaves, a processing gas is turned into plasma within the processing vessel 10, and a plasma processing is performed on the wafer W by the plasma.

Within the processing vessel 10, an upper shower plate 60 and a lower shower plate 61 are provided above the placing pedestal 20. The upper shower plate 60 and the lower shower plate 61 are made of a hollow tube material made of, for example, a quartz tube. In the upper shower plate 60 and the lower shower plate 61, a plurality of openings (not illustrated) for supplying gas to the wafer W on the placing pedestal 20 are distributed.

A plasma generation gas supply source 62 disposed outside the processing vessel 10 is connected to the upper shower plate 60 via a pipe 63. For example, Ar gas or the like is stored in the plasma generation gas supply source 62 as a gas for plasma generation. A plasma generation gas is introduced from the plasma generation gas supply source 62 into the upper shower plate 60 through the pipe 63, and, the plasma generation gas is supplied in a state of being uniformly dispersed within the processing vessel 10.

A processing gas supply source 64 disposed outside the processing vessel 10 is connected to the lower shower plate 61 via a pipe 65. A processing gas according to a formed film is stored in the processing gas supply source 64. For example, in the case of forming an SiN film on the surface of the wafer W, TSA (trisilylamine), $N_2$ gas, $H_2$ gas, and the like are stored as processing gases, and in the case of forming an $SiO_2$ film, TEOS and the like are stored. The processing gas is introduced from the processing gas supply source 64 into the lower shower plate 61 through the pipe 65, and the processing gas is supplied in a state of being uniformly dispersed within the processing vessel 10.

A decompression mechanism 70 that decompresses the atmosphere inside the processing vessel 10 is provided on the bottom surface of the processing vessel 10. The decompression mechanism 70 is configured such that an exhaust unit 71 including, for example, a vacuum pump is connected to the bottom surface of the processing vessel 10 via an exhaust pipe 72. The exhaust unit 71 evacuates the atmosphere inside the processing vessel 10 so as to decompress the atmosphere to a predetermined degree of vacuum.

Next, a plasma processing of a wafer W performed in the plasma processing apparatus 1 configured as described above will be described below.

First, a wafer W carried into the processing vessel 10 is mounted on the placing pedestal 20 by the lift pins 31. At this time, a direct current (DC) voltage is applied to the electrode 21 of the placing pedestal 20 by turning on the DC power source 22, and the wafer W is attracted to and held by the placing pedestal 20.

Then, after the interior of the processing vessel 10 is sealed, the atmosphere within the processing vessel 10 is decompressed to a predetermined pressure (e.g., 400 mTorr (=53 Pa)) by the decompression mechanism 70. Further, a plasma generation gas is supplied into the processing vessel 10 from the upper shower plate 60, and a processing gas for plasma film formation is supplied into the processing vessel 10 from the lower shower plate 61.

When the plasma generation gas and the processing gas are supplied into the processing vessel 10, the microwave generation unit 55 is operated so that in the microwave generation unit 55, microwaves of a predetermined power are generated at a frequency of, for example, 2.45 GHz. Then, an electric field is generated on the bottom surface of the dielectric window 41, the plasma generation gas is turned into plasma, the processing gas is turned into plasma, and a film forming process is performed on the wafer W by active species generated at that time. Thus, a predetermined film is formed on the surface of the wafer W.

Thereafter, when the predetermined film is grown so that a film having a predetermined film thickness is formed on the wafer W, the supply of the plasma generation gas and the processing gas and the irradiation of the microwaves are stopped. Thereafter, the wafer W is carried out from the processing vessel 10, and a series of plasma film forming processings are completed.

Next, a microwave control mechanism according to an exemplary embodiment of the present disclosure in the above-described plasma processing will be described with reference to the drawings.

Figure 3:
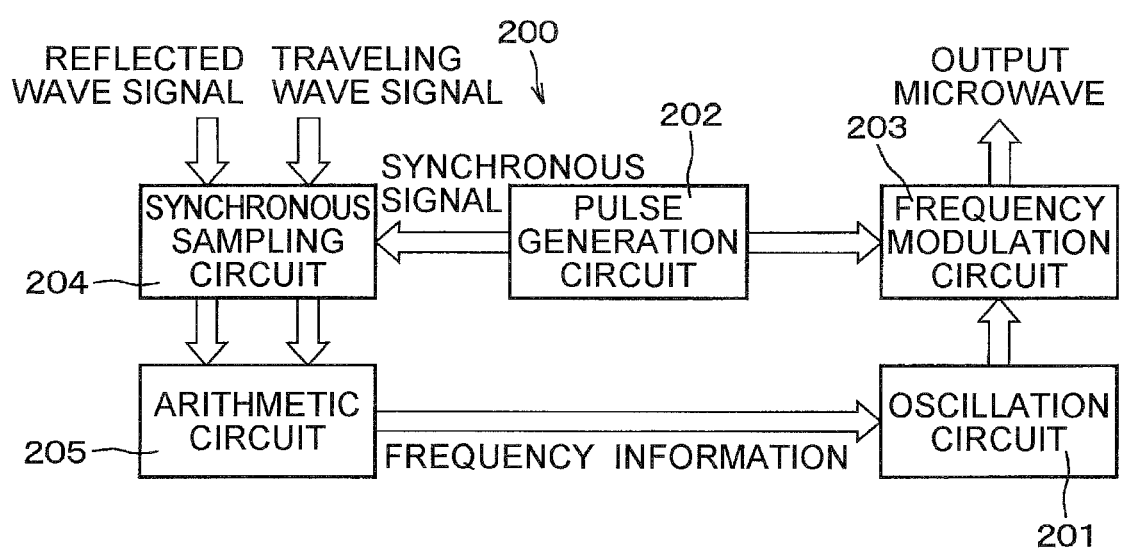
FIG. 3 is a configuration view of a microwave control circuit.

FIG. 3 is a configuration view of a circuit that performs a microwave control according to the exemplary embodiment of the present disclosure. A microwave control circuit 200 includes: an oscillation circuit 201 provided within a microwave oscillator 112 of the microwave generation unit 55 and configured to oscillate microwaves as carrier waves of a predetermined frequency; a pulse generation circuit 202 configured to generate control waves having a predetermined frequency bandwidth and generate synchronous waves of the control waves; and a frequency modulation circuit 203 configured to generate modulated waves having a predetermined frequency bandwidth by frequency-modulating the carrier waves by the control waves and outputting only the modulated waves or the carrier waves. Further, the microwave control circuit 200 includes: a synchronous sampling circuit 204 configured to receive synchronous signals from the pulse generation circuit 202 and synchronously sample reflected wave signals from a power detector 103a and traveling wave signals from a power detector 103b; and an arithmetic circuit 205 configured to compute sampled data.

Figure 4:
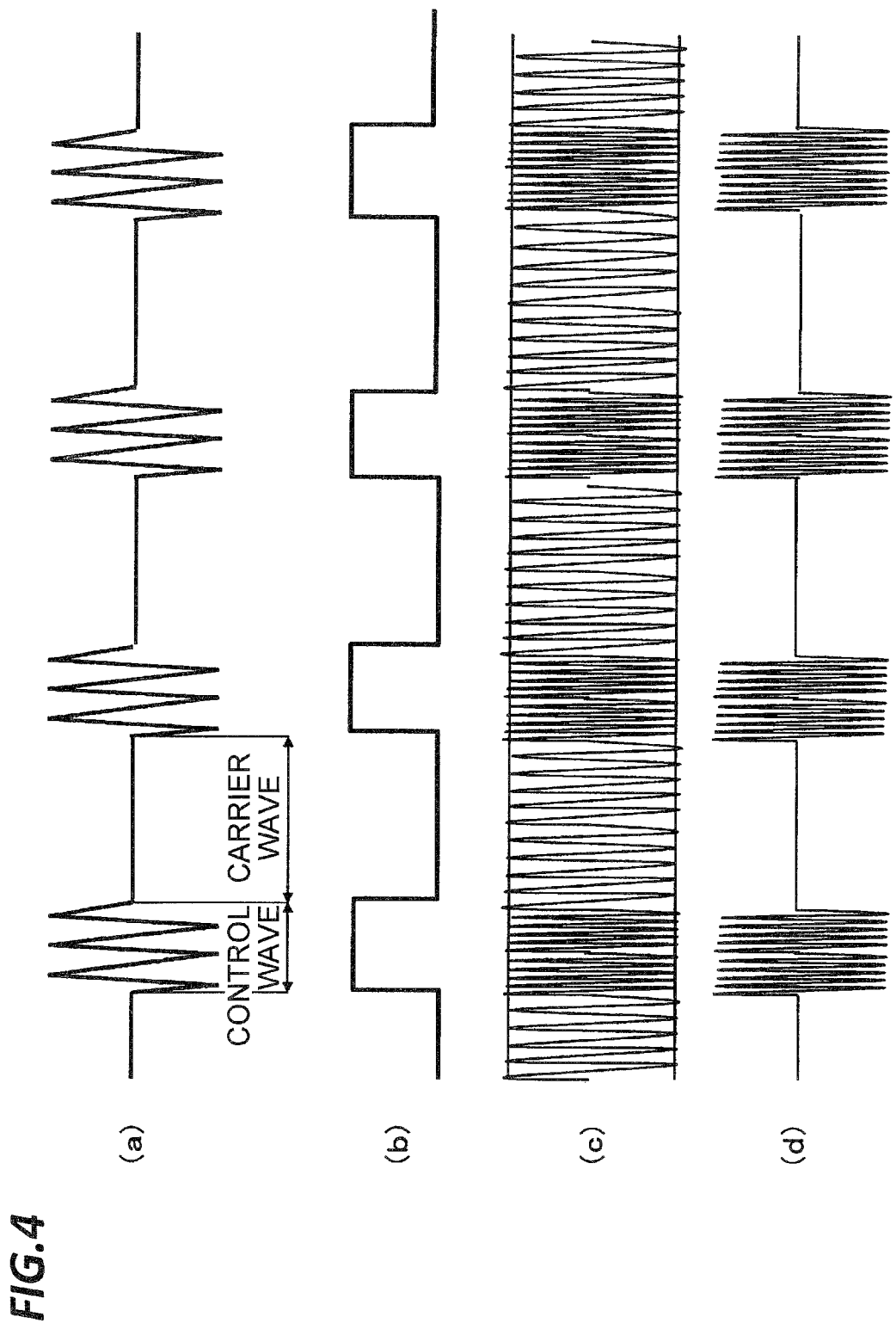

In the microwave control circuit 200 according to this exemplary embodiment of the present disclosure, reference carrier waves are first generated by the oscillation circuit 201. Further, control waves having a preset predetermined frequency bandwidth are generated by the pulse generation circuit 20. The frequency and frequency bandwidth of the control waves are properly set according to the plasma processing performed within the processing vessel 10. FIG. 4 illustrates waveform charts for explaining a frequency modulation according to an exemplary embodiment of the present disclosure. As illustrated in FIG. 4(a), the carrier wave is oscillated at a predetermined frequency, and the control wave having the predetermined frequency bandwidth is oscillated at a predetermined cycle for a predetermined time. In the case of a broadband frequency, when the control wave is for an excessively long time, matching becomes difficult and the reflected wave cannot be suppressed. Thus, it is desirable that the oscillation time is as short as possible within the range of sensitivity in which sampled data may be acquired and the oscillation time of the control wave may be, for example, about 10% or less, specifically about 1 to 2% of the entire microwave oscillation time. In addition, in order to achieve synchronization, the control wave may be repeated at a predetermined cycle. In order to perform an accurate real-time control, it is desirable that the interval at which the control wave is oscillated is as short as possible within a computable range and is set to, for example, about 200 kHz.

In synchronization with the control wave, the synchronous wave is oscillated by the pulse generation circuit 202 as illustrated in FIG. 4(b). The pulse generation circuit 202 simultaneously performs the transmission of the control wave to the frequency modulation circuit 203 and the transmission of a synchronous signal to the synchronous sampling circuit 204, and as a result, the monitoring of the reflected wave is made to be performed only when the carrier wave is modulated.

FIG. 4(c) illustrates a modulated wave in which the carrier wave is frequency-modulated by the control wave in the frequency modulation circuit 203. The traveling wave signal and the reflected wave signal of the modulated wave are synchronously sent to the arithmetic circuit 205 via the synchronous sampling circuit 204, only the time during which the synchronous wave illustrated in FIG. 4(b) is oscillated is sampled by the synchronous sampling circuit 204, and the reflected wave is monitored as illustrated in FIG. 4(d). The arithmetic circuit 205 computes, from the monitored wave, the frequency at an absorption peak at which the reflected waves are reduced.

Figure 5:
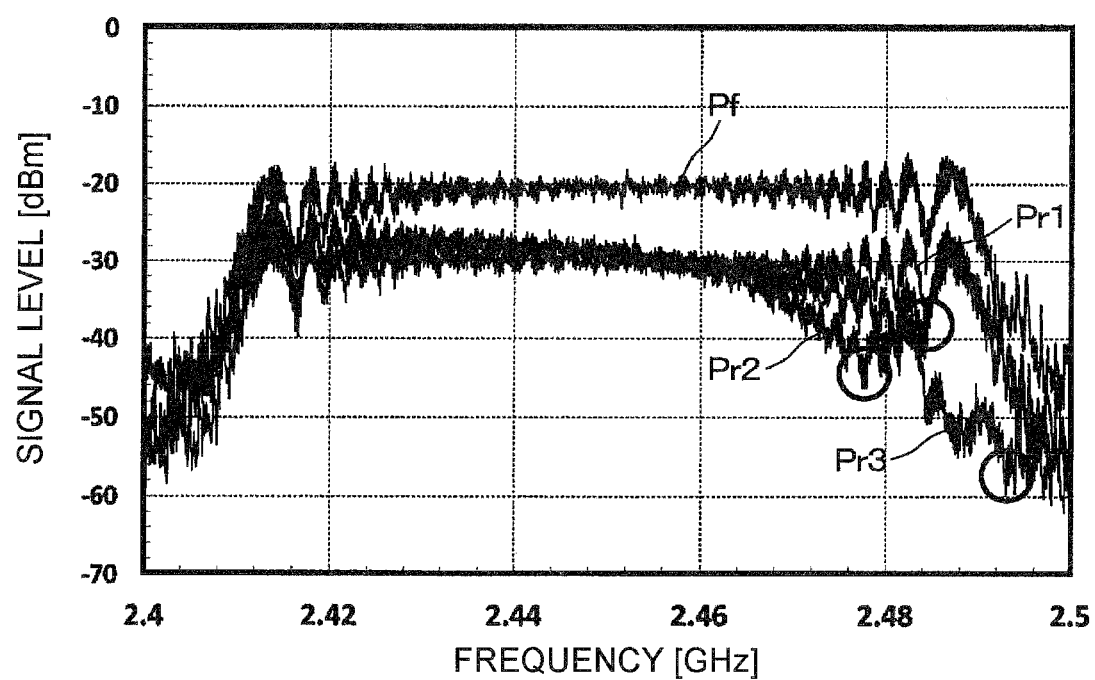
FIG. 5 is a waveform chart illustrating an example of a monitor wave.

FIG. 5 illustrates examples of monitored reflected waves. "Pf" indicates a traveling wave, and "Pr1," "Pr2," and "Pr3" indicate examples of the reflected waves by first, second, and third monitoring, respectively. In FIG. 5, portions marked with circles correspond to absorption peaks at which reflection is reduced, and indicate optimum frequencies at which the microwaves may be most efficiently absorbed to plasma, so that stable plasma can be obtained. As described above, when the optimum frequencies are determined by the arithmetic circuit 205 from the monitored reflected waves, frequency information is sent to the oscillation circuit 201.

Accordingly, the microwaves of a predetermined frequency sent from the arithmetic circuit 205 are generated in the oscillation circuit 201, and the microwaves are output to the waveguide 54 via the frequency modulation circuit 203. The microwaves sent to the waveguide 54 are propagated into the processing vessel 10 via the mode converter 53, the coaxial waveguide 50, the slot plate 42, and the dielectric window 41. Then, plasma is excited within the processing vessel 10. Subsequently, a plasma processing such as, for example, plasma etching, plasma CVD, or plasma sputtering, is performed on the wafer W on the placing pedestal 20 using the plasma excited within the processing vessel 10.

Further, during this plasma processing, the modulated wave is output from the frequency modulation circuit 203 at a predetermined cycle, the traveling wave at that time and the reflected wave from the processing vessel 10 are sent to the arithmetic circuit 205 via the synchronous sampling circuit 204, monitoring which is the same as the above-described monitoring is performed so as to determine the optimum frequency at that timing. As illustrated in FIG. 5, when processing conditions and the like are different, the frequency at the absorption peak at which the reflected waves are reduced is varied. When this frequency deviates from a predetermined range in the performance of the microwave oscillator 112, a mode jump occurs and a stable plasma processing is not performed. In the present disclosure, the mode jump can be prevented by continuously detecting the absorption peak of the microwaves in real time during the plasma processing, and when the absorption peak approaches a predetermined upper limit or lower limit of the frequency, by fixing various settings or making an error display on, for example, a display device 121.

According to the above-described exemplary embodiment, the state of plasma density can be monitored in real time by monitoring the reflected wave of the frequency-modulated modulated wave. Further, by controlling the frequency of a carrier wave by the monitored reflected wave in real time, it is possible to respond immediately to the state change of the plasma due to a change in process conditions or the like and to match the carrier wave to a frequency at which the reflection by the plasma is lowest so that high-density and uniform plasma can be generated. Further, even when the shapes of the waveguide, a matching circuit, an antenna, a dielectric, and the like of the plasma processing apparatus are different, the optimum processing performance may be exhibited correspondingly. In addition, since the consumption of an electrode material and the like of the apparatus is suppressed, an operating cost is improved.

Although the preferred exemplary embodiments of the present disclosure have been described above with reference to accompanying drawings, the present disclosure is not limited to such exemplary embodiments. It will be apparent to those skilled in the art that various modified or changed examples may be conceived within the scope of the spirit described in claims, and naturally fall within the technical scope of the present disclosure.

DESCRIPTION OF SYMBOLS

1: plasma processing apparatus
10: processing vessel
55: microwave generation unit
62: plasma generation gas supply source
64: processing gas supply source
200: microwave control circuit
201: oscillation circuit
202: pulse generation circuit
203: frequency modulation circuit
205: arithmetic circuit
W: wafer

What is claimed is:

1. A plasma processing apparatus comprising:
a microwave generation unit configured to generate a microwave;
a processing vessel configured to introduce the microwave thereinto through a radial line slot antenna; and
a gas supply source configured to supply a gas into the processing vessel, plasma being generated within the processing vessel so that a plasma processing is performed on a processing target object,
wherein the microwave generation unit includes an oscillation circuit configured to oscillate the microwave,
a pulse generation circuit configured to oscillate a control wave having a predetermined frequency bandwidth at a predetermined cycle, and
a frequency modulation circuit configured to modulate a frequency of the microwave to a modulated wave having the predetermined frequency bandwidth by the control wave and output the modulated wave, and
the frequency modulation circuit is configured to alternately and repeatedly output the modulated wave and a non-modulated microwave at the predetermined cycle, and
a frequency of the microwave is controlled in real time based on a state of plasma density which is monitored by monitoring a reflected wave of the modulated wave during the period in which the control wave is oscillated within the predetermined cycle,
wherein the microwave generation unit includes an arithmetic circuit,
the pulse generation circuit oscillates a synchronous wave in a same timing as the control wave,
a synchronous sampling circuit configured to receive a synchronous wave signal from the pulse generation circuit and synchronously sample reflected wave signals from a power detector and for supplying the signals to the arithmetic circuit; and
the arithmetic circuit monitors a reflected wave of the modulated wave in accordance with the timing of the synchronous wave, and controls the frequency of the microwave based on the monitored reflected wave.

2. The plasma processing apparatus of claim 1, wherein the frequency of the microwave is controlled by a frequency at an absorption peak of the microwave at which reflection of the reflected wave is reduced.

3. The plasma processing apparatus of claim 1, wherein an oscillation time of the control wave is 10% or less of an entire oscillation time of the microwave.

4. A plasma processing method comprising:
supplying a gas to a processing vessel configured to introduce a microwave thereinto by a radial line slot antenna; and
generating plasma within the processing vessel to perform a plasma processing on a processing target object; and
oscillating the microwave by an oscillation circuit;
oscillating a control wave by a pulse generation circuit, and having a predetermined frequency bandwidth at a predetermined cycle,
wherein a frequency of the microwave is modulated by the control wave by a frequency modulation circuit to a modulated wave having the predetermined frequency bandwidth, and the modulated wave and a non-modulated microwave are output alternately and repeatedly at the predetermined cycle, and
wherein a frequency of the microwave is controlled in real time by an arithmetic circuit based on a state of plasma density which is monitored by monitoring a reflected wave of the modulated wave during the period in which the control wave is oscillated within the predetermined cycle,
wherein a synchronous wave is oscillated by the pulse generation circuit in a same timing as the control wave, and is supplied to a synchronous sampling circuit, and a reflected wave of the modulated wave is received from the synchronous sampling circuit and is monitored by the arithmetic circuit in accordance with the timing of the synchronous wave, and the frequency of the microwave is controlled based on the monitored reflected wave.

5. The plasma processing method of claim 4, wherein the frequency of the microwave is controlled by a frequency at an absorption peak of the microwave at which reflection of the reflected wave is reduced.

6. The plasma processing method of claim 5, wherein an oscillation time of the control wave is 10% or less of an entire oscillation time of the microwave.

7. The plasma processing method of claim 4, wherein an oscillation time of the control wave is 10% or less of an entire oscillation time of the microwave.

* * * * *